United States Patent [19]

McIver

[11] 4,381,602
[45] May 3, 1983

[54] METHOD OF MOUNTING AN I.C. CHIP ON A SUBSTRATE

[75] Inventor: Chandler H. McIver, Tempe, Ariz.

[73] Assignee: Honeywell Information Systems Inc., Phoenix, Ariz.

[21] Appl. No.: 221,102

[22] Filed: Dec. 29, 1980

[51] Int. Cl.³ .............................................. H05K 3/34
[52] U.S. Cl. ...................................... 29/840; 29/832; 156/330; 174/52 FP; 174/52 PE
[58] Field of Search .................. 29/834, 840, 827, 883, 29/832, 588; 174/52 PE, 52 FP; 228/180 R, 228/175, 179; 427/96; 156/280, 330

[56] References Cited

U.S. PATENT DOCUMENTS

| | | |
|---|---|---|
| 3,325,582 | 6/1967 | Ehrmann et al. . |
| 3,726,007 | 4/1973 | Keller . |
| 3,943,623 | 3/1976 | Mizutani et al. ................ 156/330 X |
| 3,962,520 | 6/1976 | Watanabe et al. .............. 156/330 X |
| 3,982,979 | 9/1976 | Hentz et al. ........................ 29/834 X |
| 4,079,511 | 3/1978 | Grabbe ........................ 174/52 PE X |
| 4,143,456 | 3/1979 | Inoue ........................... 174/52 PE X |
| 4,159,221 | 6/1979 | Schuessler .................. 174/52 FP X |
| 4,180,608 | 12/1979 | Del ................................ 156/330 X |
| 4,195,195 | 3/1980 | de Miranda et al. . |
| 4,312,116 | 1/1982 | Moser et al. ..................... 156/330 X |

OTHER PUBLICATIONS

Hermetic Sealing Processes IBM Tech. Discl. Bulletin, vol. 18, No. 8, 1976 (p. 2470) by M. A. Robbins III et al.

*Primary Examiner*—Lowell A. Larson
*Assistant Examiner*—Carl J. Arbes
*Attorney, Agent, or Firm*—Edward W. Hughes; W. W. Holloway, Jr.; L. J. Marhoefer

[57] ABSTRACT

The method of mounting on a substrate an integrated circuit (I.C.) chip having flexible beam leads bonded to input/output (I/O) terminals on the active face of the I.C. chip. The substrate has a chip pad and outer lead (OL) pads associated with the chip pad on a surface of the substrate. Preforms of a fiber glass web coated with a thermosetting plastic are cut to a size that substantially conforms to that of the chip pad. The substrate and the chip pad are heated to a first temperature which the preform will adhere to the chip site, the preform is placed on the chip pad, and the active face of the I.C. chip is pressed into the preform. The temperature of the substrate, preform and chip, are then raised to a second temperature higher than the first to partially cure the thermoplastic material and to encapsulate the active face of the I.C. chip and portions of the leads proximate the chip in the thermoplastic material of the preform. The I.C. chip is oriented so that its leads overlie the OL pads, and its leads are thermocompression bonded to the OL pads. The substrate is then heated to a third temperature higher than the second to finally cure the thermosetting plastic.

10 Claims, 4 Drawing Figures

METHOD OF MOUNTING AN I.C. CHIP ON A SUBSTRATE

BACKGROUND OF THE INVENTION

1. Field of the Invention

This invention relates to the field of methods of mounting I.C. chips on substrates, and more particularly relates to methods for mounting integrated circuit (I.C.) chips with their active face toward the substrate on which mounted.

2. Description of the Prior Art

I.C. chips, or dies, are generally packaged as either discrete devices, one chip per package, or as part of a multichip hybrid circuit, or hybrid package, where a plurality of I.C. chips is mounted in one such package. The chips mounted in hybrid packages are frequently of different types. Each such hybrid package may be treated as a building block for complex electronic circuits and systems such as general purpose digital data processing systems.

In producing hybrid packages, an approach that lends itself to automating the process of mounting large scale I.C. chips on a multilayer substrate involves producing flexible beam lead frames which are laminated to a strip of thin plastic material such as 35 mm film. The input/output (I/O) terminals on the active face of an I.C. chip are bonded to inner lead bonding sites of the leads at the inner end of each lead of a lead frame. To mount such I.C. chips on a substrate, typically a substrate will have an alumina base and multiple layers of conductors and dielectrics, the I.C. chips and a portion of their leads are blanked from the lead frames and the film segments to which each frame is attached. The outer lead bonding sites of the leads attached to each I.C. chip are formed to produce a foot at the free end of each such lead and the outer lead bonding sites, the bottom surface of each such foot is substantially parallel to the active face of the I.C. chip but is displaced so as to be automatically aligned with the back face of the chip. The back faces of such chips are metallized so that essentially simultaneously the back faces can be soldered to a metallized chip pad on the surface of a substrate and the outer lead sites of the leads to the outer lead pads of the substrates, typically by a reflow soldering process.

The problems associated with the prior art methods of packaging I.C. chips having flexible beam leads particularly when mounted on a fired multilayer substrate are the result of the additional manufacturing steps needed to mount such I.C. chips on such a substrate in this manner, such as metallizing the back space of the I.C. chip and forming the leads of the chip so that the outer bond sites of the leads will contact the I/O pads associated with it each chip site of a substrate. Each manufacturing step has associated with it a cost that must be reflected in the ultimate cost of the product and normally each additional manufacturing step will decrease the reliability of the package. In addition, the prior art methods impose the requirement that the I.C. chips have a substantially uniform thickness which thickness has to be maintained with a high degree of accuracy in order to obtain good outer lead bonds, where an outer lead bond is the bond between the outer lead bonding site of the leads and the OL pads of the substrate. Since the active face of each I.C. chip with its I/O terminals to which the inner lead bonding sites of the leads are bonded are exposed in packages produced by the relevant prior art processes, both the active faces of the chips and their leads are subject to mechanical damage, as well as chemical attack or corrosion. Prior art processes also resulted in edge shorts which occur if a lead touches an outer edge of the active face of an I.C. chip, for example. It also should be noted that the strength of the inner lead bonds between the inner lead bonding sites of the leads and the I/O terminals of the chips are physically weaker, i.e., they fail at lower tensile stresses than the outer lead bonds between the outer lead bonding sites of the bonds and the outer lead pads to which they are joined.

It is, therefore, an object of this invention to provide an improved process for mounting I.C. chips on a substrate which is less costly and produces more reliable packages at lower cost.

It is yet another object of this invention to provide a process in which the thickness of the I.C. chips mounted on the substrate is not a critical parameter.

It is yet another object of this invention to provide a process for mounting I.C. chips on a substrate in which the step of metallizing the back surface of the chips may be eliminated.

It is yet another object of this invention to provide a process for mounting I.C. chips on a substrate which provides mechanical and environmental protection for the active face of the chip and the inner lead bonds of the leads to the I/O terminals of the chip.

It is still another object of this invention to provide a process for mounting an I.C. chip on a substrate in which no corrosive chemicals are used.

It is a further object of this invention to provide a process for mounting an integrated circuit chip on a substrate in which the strength of the inner leads bonds of the chips are enhanced.

SUMMARY OF THE INVENTION

The present invention provides an improved method of mounting on a substrate an I.C. chip having flexible beam leads bonded to I/O terminals on the front face of the I.C. chip. The substrate is provided with at least one chip pad having an area which is substantially the same as that of the active face of the chip. Around the perimeter of the chip pad are located outer lead pads. The first step of the process comprises forming a preform by cutting a web of fiber glass filaments coated with a thermosetting plastic into a size and shape which substantially equals, or is slightly smaller than, that of the chip pad on which the preform is to be placed. The substrate and chip pad are heated to a temperature in the range of from 110°–120° C., at which temperatures the thermosetting plastic of the preform becomes tacky. The preform is then placed on the chip pad so that it substantially covers it. An I.C. chip is then positioned on the preform with its active face in contact with the preform. The I.C. chip is forced into the preform to an extent of about 1–2 mils by a force of from 25–50 grams. The substrate, chip, and preform are then heated to a temperature substantially in the range of about 170° C., for a period of time of substantially 20 minutes which partially cures the thermoplastic material of the preform and causes the plastic material to flow and encapsulate the front face of the I.C. chip and that portion of the leads bonded to the I/O terminals of the chip which are proximate the chip. The plastic also flows between the chip face and the leads. The presence of the plastic material between the chip face, particularly at the side edges of the active face prevents the possibility of edge shorts. The I.C. chip is oriented on the chip pad so that the outer lead bonding sites of the leads overlie the outer lead pads of the substrate and the outer lead bonding sites are substantially simultaneously thermocompression bonded to outer lead pads. The substrate is then heated to a temperature of substantially 180° C. for approximately 30 minutes to finally cure the thermosetting plastic material of the preform.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DETAILED DESCRIPTION OF THE INVENTION

Figure 1:
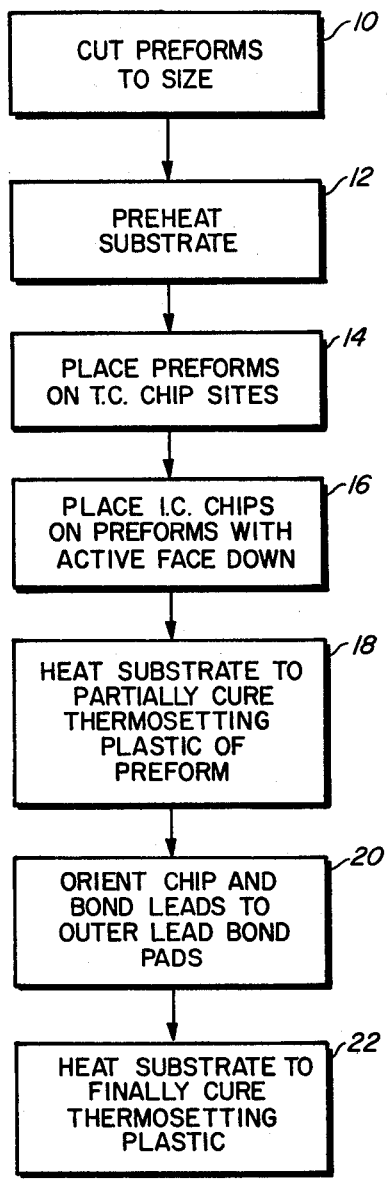
FIG. 1 is a flow chart of the steps of the process of the invention.
Figure 2:
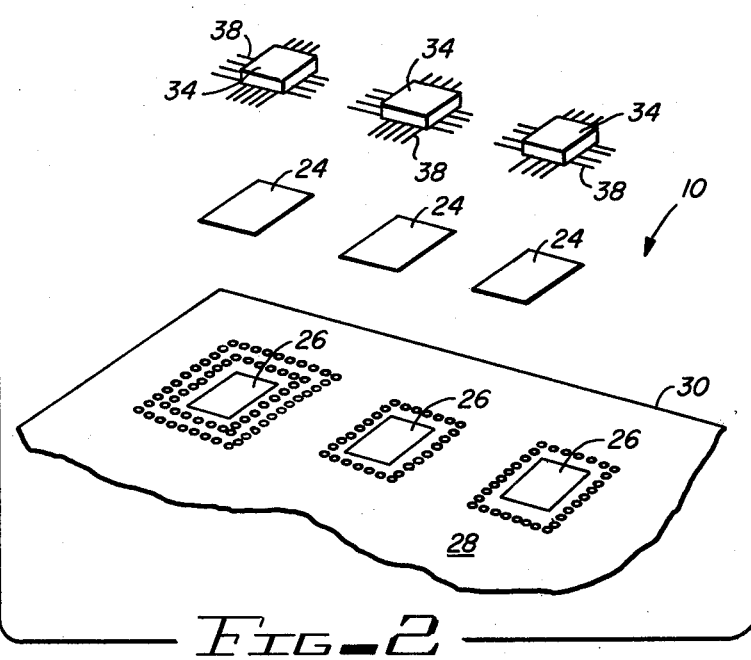
FIG. 2 is an expanded view of the I.C. package produced by the process of this invention.
Figure 3:
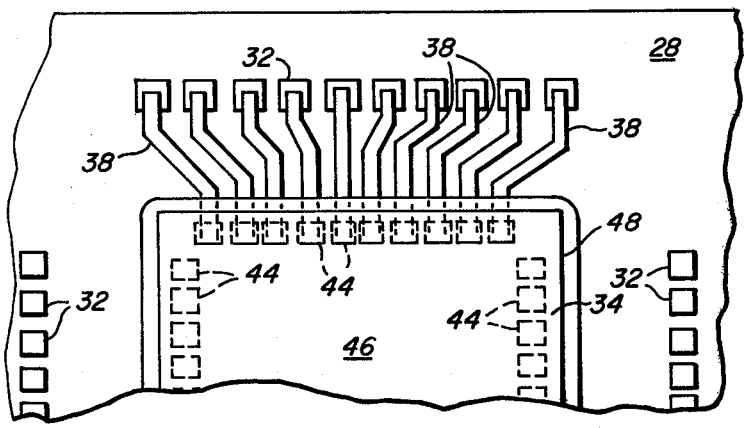
FIG. 3 is a plan view of an I.C. chip mounted on a substrate which is partly broken away and on a greatly enlarged scale.

In FIG. 1, steps 10, 12, 14, 16, 18, 20 and 22 of the process are illustrated. In the first step, 10, a preform 24 as best illustrated in FIG. 2, is cut from a sheet of fiber glass which is coated with a thermosetting plastic material such as a B stage epoxy. The preforms 24 are cut to a size that will substantially fit, or cover an I.C. chip pad 26 which is formed on the upper surface 28 of a multilayer substrate 30. The typical substrate 30 will have a substantial number of I.C. chip pads 26 formed on the upper surface 28 in the range of from 20-100 if substrate 30 has dimensions of 3 inches by 3 inches, for example.

The typical multilayer substrate 30 has an alumina base on one surface of which alternate layers of a thick film conductor paste and an electrical insulating or dielectric paste are laid down or printed through a screen and fired to make electrical connections between the outer lead pads 32 which are associated with each I.C. chip pad 26 and between the outer lead pads 32 and I/O pads at the perimeter of substrate 30, which pads are not illustrated in FIG. 2. In the preferred embodiment, the preforms 24 are cut from a sheet approximately 3-5 mils thick in which the web is made of 1-mil glass filaments. Such a film is commercially available from the Ablestik Laboratories, Gardena, CA, under the trade name Able Film 550K. The thermosetting plastic material with which the web is coated is a B stage epoxy.

When a sufficient number of preforms 24 are formed so that a preform can be placed on each metalized chip pad, or site, 26 on which an IC chip 34 is to be mounted, the second step 12 of the process is preformed. During this step substrate 30 is heated to a temperature at which the thermosetting plastic of preforms 24 will become tacky and each preform 24 will adhere to the I.C. chip pad 26 on which it is placed. In the preferred embodiment this temperature in the range of from 110°-120° C.

When preheat step 12 is completed, the third step 14 of the process is performed. During the third step, preforms 24 are placed on the I.C. chip pads 26 of a substrate 30 on which the I.C. chips 34 are to be mounted.

Figure 4:
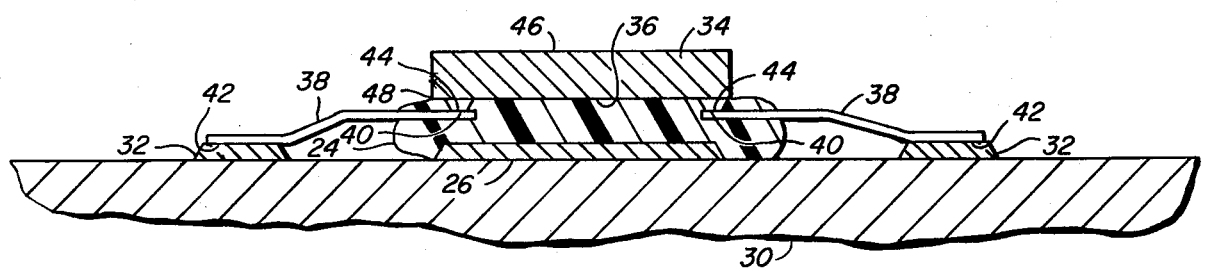
FIG. 4 is a sectional view of an I.C. chip mounted on a substrate which is partly broken away.

After the preforms are in place, the fourth step 16 is executed. During the fourth step I.C. chips 34 are placed on preforms 24 with the active face 36 of each IC chip 34 in contact with a preform 24. Each chip 34 is provided with flexible beam leads 38, and each flexible beam lead 38 is provided with an inner lead bonding site 40 and an outer lead bonding site 42 which sites 40, 42 or on opposite side of leads 18. Prior to chips 34 being mounted on substrate 30, the inner lead bonding sites 40 of leads 28 are bonded to the I/O terminals, or bumps 44 which are located on the active face 36 of each I.C. chip 34, as is best seen in FIG. 4. To make certain that each I.C. chip 34 is held by the preform 24 on which it is placed, each I.C. chip 34 has force applied to its back face, or surface, 46 a force which, in the preferred embodiment is in the range of from 25-50 grams.

After all the I.C. chips 34 have been mounted on their respective preforms in step 16, performance of step 18 is initiated. Substrate 30 is placed in a suitable furnace and heated to a temperature which will partially cure the thermosetting plastic of each of the preforms 24. In the preferred embodiment in which the outer lead pads 32 and the conductors of the conductive layers of the multilayer substrate 30 are of copper, substrate 30 with chips 34 in place are heated in a furnace having an inert atmosphere such as nitrogen and are heated to a temperature of substantially 170° C. for a period of substantially 20 minutes in the preferred embodiment. Partially curing of the thermosetting plastic of preforms 24 will cause the thermoplastic material of the preform to encapsulate the active faces 36 of the IC chips 34, to flow around, or encapsulate, the portions of leads 38 proximate to each IC chip, and to flow between the leads 38 and the perimeters 48 of the active faces 36 of I.C. chips 34, to prevent contact between leads 38 and the active faces 36 of chips 34. The fiber glass web of each preform 24 ensures the electrical isolation of the I/O terminals 44 and the leads 38 of each chip 34 from its metalized pad 26 and thus prevents electrical short circuits between I/O terminals 44 of each chip 34. While the thermosetting plastic of each of the preforms 24 is in the partially cured state and still can be deformed relatively easily at the completion of step 18, performance of step 20 is initiated. During process step 20 each I.C. chip 34 is oriented on its chip pad 26 so that the outer lead bonding site 42 of each lead 38 directly overlies outer lead pad 32 to which it is to be bonded. The outer lead bonding sites 42 of lead 38 are then bonded to outer lead pads 32 using a conventional thermocompression bonding technique in which all of the leads of a given chip 34 are bonded to the outer lead pads 42 associated with the chip pad 26 on which the IC chip 34 is mounted substantially at one time. Partial curing of the thermosetting plastic material of the preforms 24 prior to thermocompression bonding of the outer lead sites 42 to OL pads 32 prevents the heat associated with the thermocompression bonding of outer leads bonding sites 42 to the outer lead pads 32 from producing bubbles in the plastic material of preforms 24, which bubbles would provide possible entries for corrosive materials to attack either active faces 36 or the I/O terminals 44 of chips 34, or the inner lead bonds between I/O terminals 44 and leads 38.

At the completion of step 20, substrate 30 is again placed in an inert gas furnace and heated to a temperature at which the thermosetting plastic material of preform 24 will become finally, or completely, cured. In the preferred embodiment, the substrates 30 are heated to a temperature of substantially 180° C. for a period of substantially 30 minutes. Finally curing the thermosetting plastic materials of preforms 24 constitutes the last step 22 of the process.

To aid in dissipating heat produced by each of the chips 34 when power is supplied to them, it is preferable that the thermosetting plastic of preforms 24 be as good a thermal conductor as possible while retaining their high electrical resistance, and those characteristics that cause the thermosetting plastic material to encapsulate the active faces 36 of I.C. chips 34. This is accomplished by loading the thermosetting plastic of preforms 24 with a good thermal conductor which is not a good electrical conductor, examples of such materials as powdered alumina or berrylium oxide as is well known in the art. A further aid in dissipating heat produced by each of the chips 34, particularly in minimizing hot spots in chips 34, is fabricating each metalized chip pad 26 of a material that is a good thermal conductor, such as gold, copper, silver, aluminum or the like.

The substantially simultaneous thermocompression bonding of the outer lead bonding sites 42 associated with the leads 38 to the outer lead pads 32 associated with each chip 34, places each of the leads 38 under compression with leads 38 being slightly bent away from the surface 28 of substrate 30 as illustrated in FIG. 4. Such a structural arrangement has the advantage of preventing a change in the direction of stresses applied to each lead 18 as it is exposed to temperature changes in the normal course of use. Such stresses can break the inner or outer lead bonds unless they are properly compensated. The arrangement of the leads 38 when chips are mounted on a substrate 30 in practicing the process of this invention results in the leads 38 staying under compression even when the temperature of the ambient environment of a substrate 30 is at its lowest operational limit. Increases in temperature do not lead to higher stresses, but rather have the effect of increasing the amount of bending of the leads 38 away from the surface 28 of the substrate 30. Encapsulating the active face 36 of each of the I.C. chips 34 in a thermosetting plastic increases the strengths of the inner lead bonds between the inner lead bonding sites 40 of the leads 38 in the I/O terminals 44 of each of the I.C. chips 34 and also protects the active face 36 of chips 34 from attack by chemical agents that may be present in the ambient environment of the package.

It should be evident that various modifications can be made to the described invention without departing from the scope of the present invention.

What is claimed is:

1. Method of mounting on a substrate an I.C. chip having flexible beam leads bonded to I/O terminals on the active face of the chip, said substrate having a metalized chip pad and outer leads pads on a surface of said substrate, comprising the steps of:
   forming a preform made of a fiber glass web coated with a thermosetting plastic material to a size which substantially conforms to that of the chip pad;
   preheating the substrate to a first temperature at which the thermosetting plastic of the preform becomes tacky;
   placing the preform on the chip pad so that the preform adheres to the chip pad and pressing the chip with its active face down into the preform to initiate the process of encapsulating the active face of the I.C. chip and that portion of the leads proximate said chip in the plastic material of the preform;
   partially curing the thermosetting plastic of the preform;
   orienting the I.C. chip so that each of its leads substantially overlies an outer lead pad and bonding the outer lead bonding site of each lead to the outer lead pad it overlies; and
   finally curing the thermosetting plastic material.

2. The process of claim 1 in which the metalized chip pad is made of a good electrically and thermally conductive material.

3. The process of claim 2 in which the thermosetting plastic material is a B stage epoxy.

4. The process of claim 3 in which the thermosetting plastic material is loaded with a good thermal conductor which is not a good electrical conductor.

5. The process of claim 4 in which the good thermal conductor which is not a good electrical conductor is selected from the group consisting of powdered alumina and berrylium oxide.

6. Method of mounting I.C. chips on a substrate, each I.C. chip having flexible beam leads bonded to I/O terminals on the active face of each chip, said substrate having a plurality of metalized chip pads and a plurality of outer lead bonding pads associated with each chip pad on a surface of said substrate comprising the steps of:
   preheating the chip pads to a first temperature;
   placing preforms comprised of a web coated with a thermosetting plastic material, said preform substantially covering the chip pad on which placed, and pressing the chips with their active faces down into the preforms to initiate encapsulating the active faces of the I.C. chips and that portion of their leads proximate each said chip in the plastic material of the preforms;
   partially curing the thermosetting plastic of the preforms by heating the substrate to a second temperature for a first period of time;
   orienting the I.C. chips so that their leads overlie the outer lead pads and bonding the leads to the outer lead pads of the substrate; and
   heating the substrate to a third temperature to finally cure the thermosetting plastic material of the preforms for a second period of time.

7. The process of claim 6 in which the metalized chip pads are made of a metal selected from the group consisting of gold, copper, silver, or aluminum.

8. The process of claim 7 in which the preforms comprise a web of glass fiber filaments coated with a B stage epoxy.

9. The method of claim 8 in which the B stage epoxy includes a good thermal conductor which is not a good electrical conductor.

10. The method of claim 9 in which the good thermal conductor which is not a good electrical conductor is selected from the group consisting of powdered alumina and berrylium oxide.

* * * * *